United States Patent
Goodlin et al.

(10) Patent No.: US 8,043,973 B2
(45) Date of Patent: Oct. 25, 2011

(54) MASK OVERHANG REDUCTION OR ELIMINATION AFTER SUBSTRATE ETCH

(75) Inventors: Brian Goodlin, Plano, TX (US); Thomas D Bonifield, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 201 days.

(21) Appl. No.: 12/467,019

(22) Filed: May 15, 2009

(65) Prior Publication Data
US 2009/0289324 A1 Nov. 26, 2009

Related U.S. Application Data

(60) Provisional application No. 61/055,220, filed on May 22, 2008.

(51) Int. Cl.
*H01L 21/302* (2006.01)
*H01L 21/461* (2006.01)

(52) U.S. Cl. ......... 438/739; 257/E21.257; 257/E21.549; 257/E21.564; 257/E21.578; 438/424; 438/435; 438/624; 438/701; 438/734; 438/978

(58) Field of Classification Search ........... 257/E21.257, 257/E21.549, E21.564, E21.578; 438/424, 438/435, 624, 701, 714, 734, 739, 978
See application file for complete search history.

(56) References Cited

U.S. PATENT DOCUMENTS
5,308,415 A * 5/1994 Chou ............................ 438/714
* cited by examiner

*Primary Examiner* — Asok Sarkar
(74) *Attorney, Agent, or Firm* — Yingsheng Tung; Wade J. Brady, III; Frederick J. Telecky, Jr.

(57) ABSTRACT

A method of forming IC devices includes providing a substrate and forming a patterned masking layer including at least one masked region having at least one masking layer, and a feature region bounded by the masking layer. Etching forms an etched feature in the substrate, wherein undercutting during the etching forms at least one mask overhang region over a surface portion of the etched feature that is recessed relative to an outer edge of the masking layer. A pullback etch process exclusive of any additional patterning step laterally etches the masking layer. The conditions for the pullback etch retain at least a portion of the masking layer and reduce a length of the mask overhang region by at least 50%, or eliminate the mask overhang region entirely. The etched feature is then filled after the pullback etch process to form a filled etched feature.

7 Claims, 7 Drawing Sheets

MASK OVERHANG REDUCTION OR ELIMINATION AFTER SUBSTRATE ETCH

CROSS REFERENCE TO RELATED APPLICATIONS

This application claims the benefit of Provisional Application Ser. No. 61/055,220 entitled "Method For Elimination or reduction of Mask undercut after Deep Si etch", filed May 22, 2008, which is herein incorporated by reference in its entirety.

FIELD OF THE INVENTION

Embodiments of the present invention relate to semiconductor fabrication processes that include filled etched features, and integrated circuits (ICs) therefrom.

BACKGROUND

As known in the art of semiconductor fabrication, etch processes to form deep features (e.g., 1 µm, or more) are known to be susceptible to significant lateral undercut of the substrate under the masking layer(s). Many of these etch processes involve etching of the substrate material (e.g., Si) to form etched features, such as for trench isolation or through substrate vias (TSVs) (e.g., through silicon vias). The mask typically comprises photoresist, a dielectric, or a combination of the two (e.g., photoresist on a dielectric or a dielectric stack). Subsequent processes can involve filling of the etched feature. Significant lateral undercut of the substrate under the masking layer(s) can lead to a variety of fill problems, such as voids or improper plating in the case of TSV formation.

Some methods are known for reducing lateral mask overhang and as a result, the lateral substrate undercut. One method comprises complete removal of the sacrificial masking layer(s) after the etch, such as removal of a silicon oxide masking layer that is wet-etched off completely or a photoresist masking layer that is stripped off after the etch. Although this method is generally effective when the masking layer(s) are fully sacrificial, this method is not possible when at least a part (e.g., one or more layers of a mask stack) of the mask layer(s) are non-sacrificial and thus remain for subsequent processing. Another method comprises re-patterning with the original masking layer(s) that defines the overhang present after the etch, and then another etch step for etching the overhang portion of the masking layer(s) away. Moreover, this method requires an additional photolithography step that adds cost and process complexity due to generally complicated alignment/patterning.

Yet another method comprises deep etch (e.g., Si etch) process changes (different gas mixtures) to reduce lateral mask overhang to reduce the lateral substrate undercut. This method is often very costly in terms of loss of etch rate to achieve a reduction in lateral overhang. Moreover, it is generally difficult or impossible to largely eliminate the lateral overhang and resulting lateral undercut using this method, particularly for deep etch processes.

SUMMARY

Embodiments of the inventions describe new semiconductor processes that involve etching that pulls back the mask material(s) that hangs over the substrate (e.g., Si) in the case of a mask overhang following an etch process. Such embodiments reduce or eliminate the mask overhang and result in reduced or eliminated lateral substrate undercut. Embodiments of the present invention are generally applicable when at least part of at least one of the masking layer(s) is non-sacrificial. As used herein, "non-sacrificial" means at least part of the masking layer(s) continues on for at least one step of subsequent processing, including in some embodiments of the invention part of the final IC. Significantly, embodiments of the invention are generally inexpensive as compared to known overhang/undercut reduction methodologies since embodiments of the invention do not generally involve any changes to the etch process that creates the etched feature, and do not generally involve any additional patterning steps.

A positive step is defined herein to be present when the edge of the masking material is recessed from the edge of the substrate over the etched feature (e.g., via), and is one example of a structure that eliminates mask overhang. Reduction or elimination (e.g., formation of a positive step) of masking layer overhang and the resulting reduction or elimination in lateral substrate undercut has been found by the Present Inventors to lead to a reduction in fill problems, including a reduction in voids or improper plating (e.g., copper plating) in the case of TSV formation. In one embodiment of the invention, the etch is a deep etch to form a deep etched feature that is generally at least 1 µm deep, such as at least 10 µm or at least 50 µm deep.

In one example, the masking layer stack comprises photoresist on a dielectric stack which is on a Si substrate, where the dielectric stack is non-sacrificial, and thus the mask overhang and resulting substrate undercut can be an issue. The etching is generally from the topside of the wafer as in the case of trench isolation, DRAM capacitor or via-first TSV processing, but can also be from the backside of the wafer for certain processes.

In one embodiment of the invention a method of forming IC devices having filled etched features includes providing a substrate having a top semiconductor surface and a bottom surface, and forming a patterned masking layer including at least one masked region having at least one masking layer thereon and at least one feature region bounded by the masking layer. Etching is used to form an etched feature in the substrate, wherein undercutting during the etching results in formation of at least one mask overhang region over a surface portion of the etched feature that is recessed relative to an outer edge of the masking layer. A pullback etch process exclusive of any additional patterning step following the etching laterally etches the masking layer. The conditions for the pullback etch process are selected to retain at least a portion of the masking layer and reduce a length of the mask overhang region by at least 50% or to eliminate the mask overhang region entirely (i.e. create a positive step). The etched feature is then filled after the pullback etch process to form a filled etched feature.

ICs based on methods according to embodiments of the invention include filled etched features having positive steps on opposing sides at the surface of the feature. The lengths of the first and second step can average within 5% of one another, so that ICs according to embodiments of the invention are readily identifiable by their positive steps and perfect or near-perfect step symmetry.

DETAILED DESCRIPTION

Figure 1:
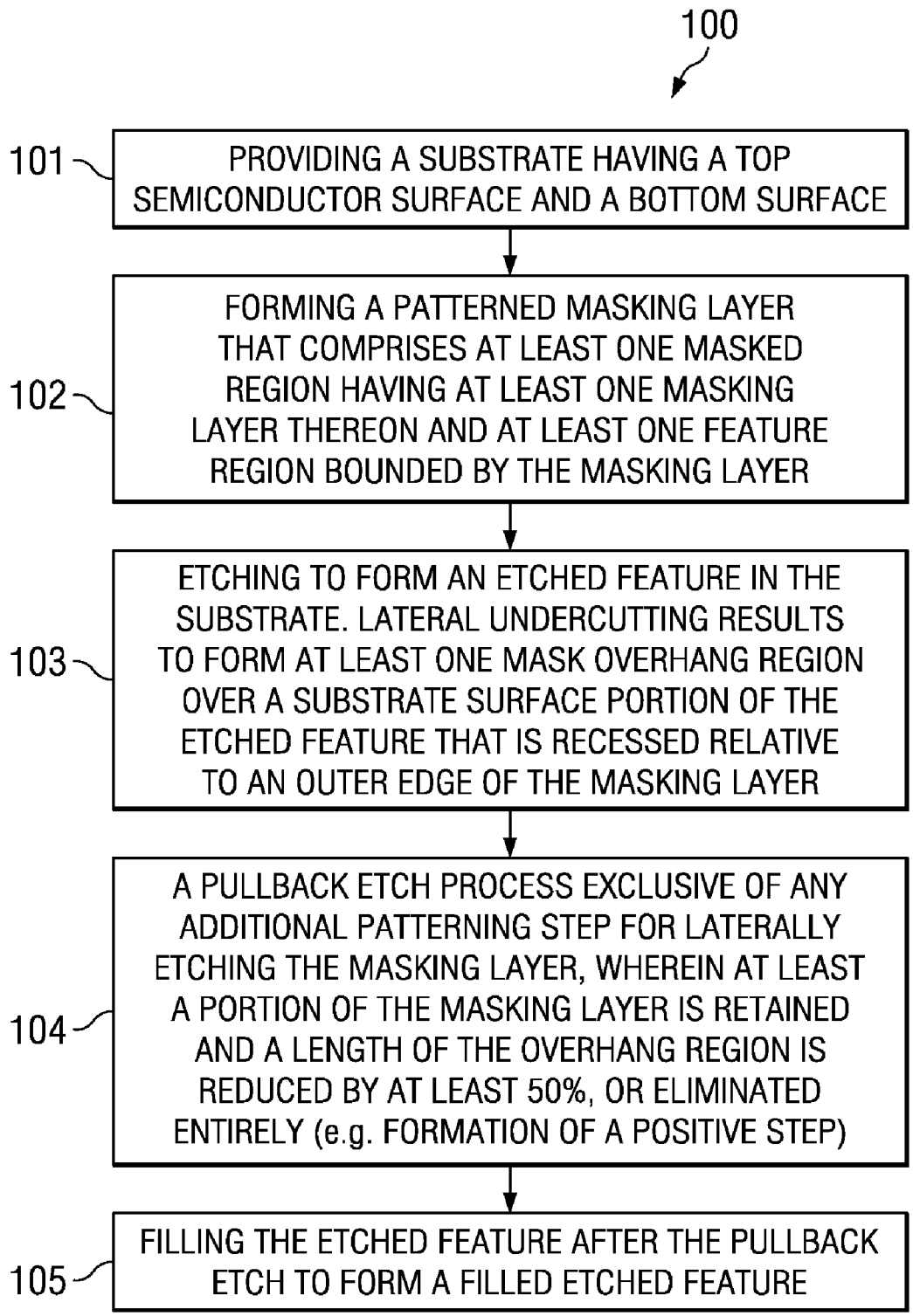
FIG. 1 show steps in a method for forming IC devices having filled etched features that have reduced or eliminated lateral undercut, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

FIG. 1 show steps in a method 100 for forming IC devices having filled etched features that have reduced or eliminated lateral undercut, according to an embodiment of the invention. Step 101 comprises providing a substrate having a top semiconductor surface and a bottom surface. The substrate can be a bulk substrate such as a bulk Si substrate, or an alternative substrates such as a SiGe substrate, or a semiconductor on insulator (SOI) substrate, for example. In step 102 a patterned masking layer is formed that comprises at least one masked region having at least one masking layer thereon and at least one feature region bounded by the masking layer. Step 103 comprises etching to form an etched feature in the substrate. The etch can be a deep etch, such as to form an etched feature that is at least 1 µm deep. The etching can be from the top semiconductor surface or from the bottom surface of the substrate. Particularly during deep etching, such as a depth of 10 µm or more, the lateral overhang and resulting lateral undercut can extend a distance of 0.3 µm or more. Following etching, at least one mask overhang region is formed over a substrate surface portion of the etched feature that is recessed relative to an outer edge of the masking layer.

Step 104 comprises a pullback etch process exclusive of any additional patterning step following the etching. The pullback etch process laterally etches the masking layer(s), wherein conditions for the pullback etch process are selected to retain at least a portion of the masking layer(s) and reduce a length of the overhang region by at least 50%, or to eliminate the overhang region entirely (e.g., form a positive step). The pullback etch process can be a dry etch-based, a wet etch-based, or a combination of dry and wet etches. Step 105 comprises filling the etched feature after the pullback etch to form a filled etched feature.

Figure 2A:
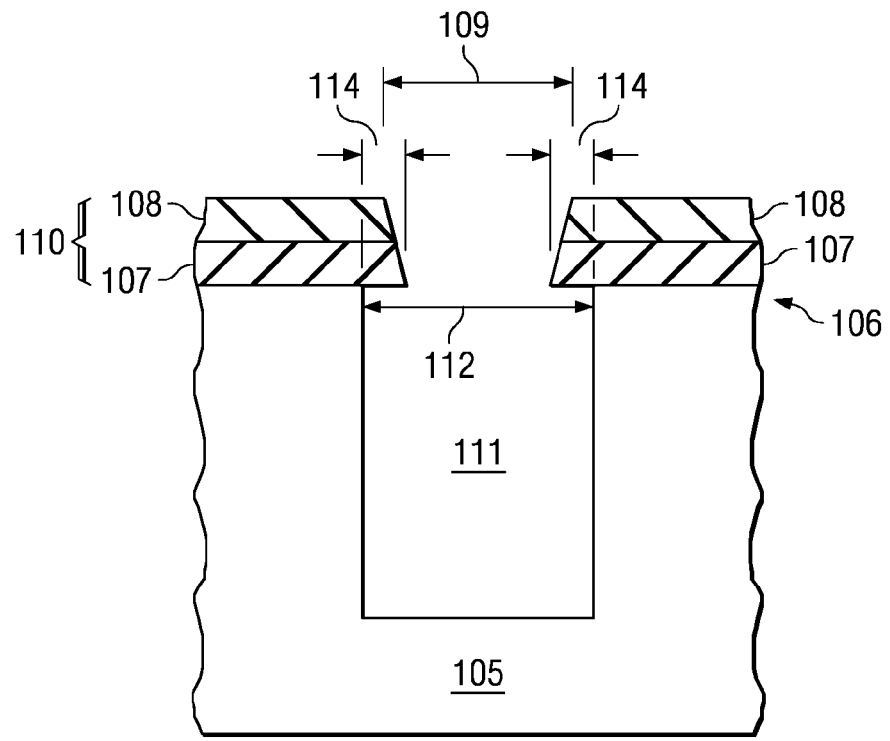
FIGS. 2A-C show simplified cross sectional depictions of a wafer portion following an etch process that creates a mask overhang and resulting lateral undercut of the substrate under a sacrificial/non-sacrificial masking layer stack, then a dry etch-based etch process to reduce or eliminate the mask overhang, and a final removal process for removing the sacrificial masking layer, according to an embodiment of the invention.
Figure 2B:
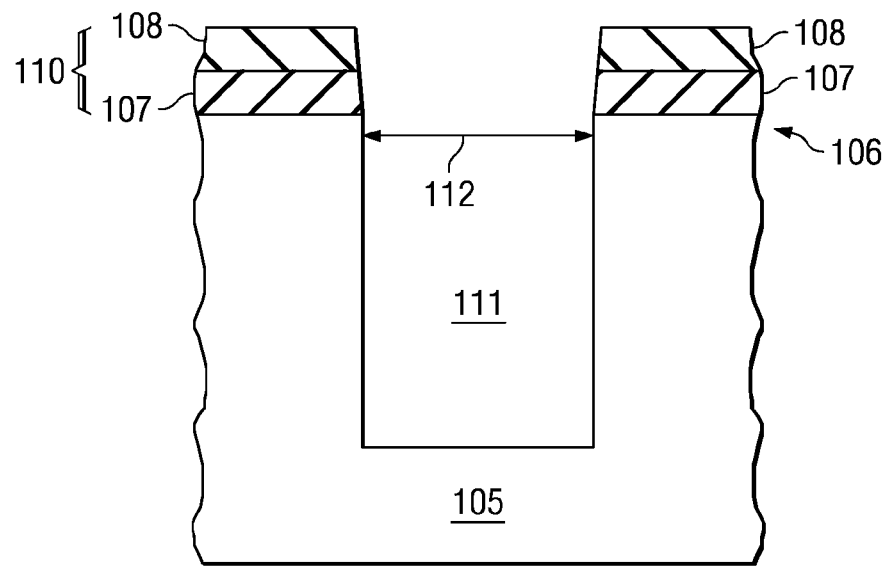
Figure 2C:
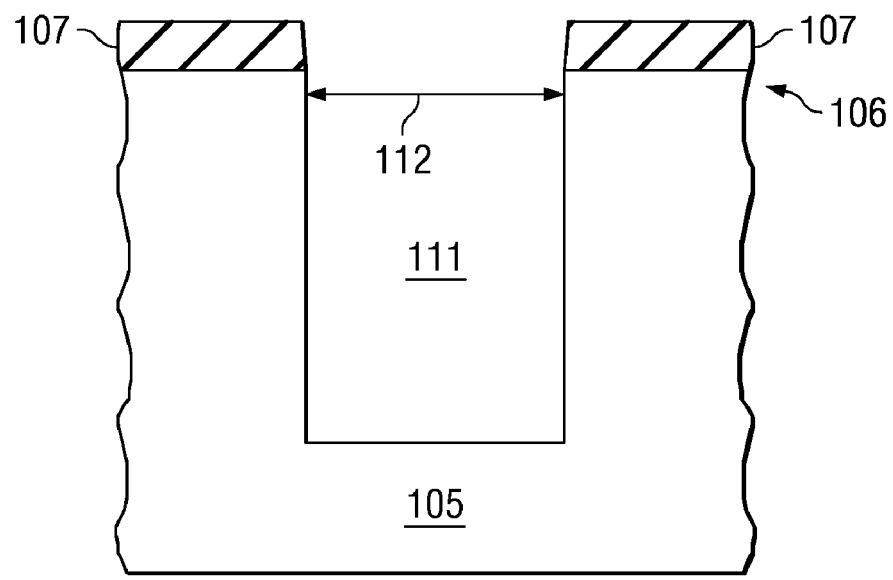

FIGS. 2A-C show simplified cross sectional depictions of a wafer portion following an etch process that creates mask overhang and resulting lateral undercut of the substrate under a sacrificial layer/non-sacrificial masking layer stack, then an dry etch-based etch process to reduce or eliminate the mask overhang and resulting lateral undercut, and a final removal process for removing the sacrificial masking layer, respectively, according to an embodiment of the invention. The structure shown in FIG. 2A comprises a substrate 105 having a semiconductor surface 106, and a patterned masking layer stack 110 on the semiconductor surface 106 comprising a top sacrificial layer 108 and a bottom non-sacrificial layer 107 under the top sacrificial layer 108. In one embodiment, the top sacrificial layer 108 comprises photoresist and the bottom non-sacrificial layer 107 comprises a silicon oxide or other hard mask material (e.g., SiN, SiC, SiON). An aperture 109 in the patterned masking layer stack 110 is shown along with an etched feature 111 formed in substrate 105 having width dimension 112 that is bounded at the semiconductor surface 106 by the masking layer stack 110. A mask overhang region 114 can be seen resulting from the lateral mask undercut that occurred during the etch process to form the etched feature 111 that defines a recess in the surface portion 106 of the etched feature 111.

FIG. 2B shows a cross sectional depiction following a dry pullback etch. The dry pullback etch process is exclusive of any additional patterning step since it uses the existing patterned masking layer stack 110. In one embodiment, the dry pullback etch comprises reactive ion etching (RIE). The dry pullback etch laterally etches both the bottom non-sacrificial layer 107 and in embodiments that use RIE the top sacrificial layer 108 as well, to substantially reduce or eliminate the mask overhang region 114. The dry pullback etch is generally a highly selective etch that minimizes etching of the semiconductor surface 106 and walls of the etched feature 111.

The conditions for the pullback etch process are selected to retain at least a portion of the masking layer stack 110 and reduce a length of the mask overhang region 114 by at least 50%, or to eliminate the overhang region entirely (e.g., form a positive step). In one embodiment, the dry etch comprises a F-based plasma etch, such as based on $CF_4$ or $SF_6$, which is generally used together with $O_2$. Carbon-based etch gases are known to help prevent or at least reduce Si etching which is generally helpful when the substrate 105 comprises Si. For example, the pressure can be from 10 mTorr to 250 mTorr, the bias power between 10 Watts to several thousands of Watts, and an optional carrier gas can be used, such as He, $N_2$ or Ar.

FIG. 2C shows a cross sectional depiction after removal of a top sacrificial layer 108 of masking layer stack 110. In the embodiment shown, the top sacrificial layer 108 can comprise photoresist. Conventional photoresist stripping processes, such as a dry, wet or ashing process, can generally be used to remove the photoresist. The mask overhang region 114 that was clearly shown in FIG. 2A can be seen to be absent in FIG. 2C.

Figure 3A:
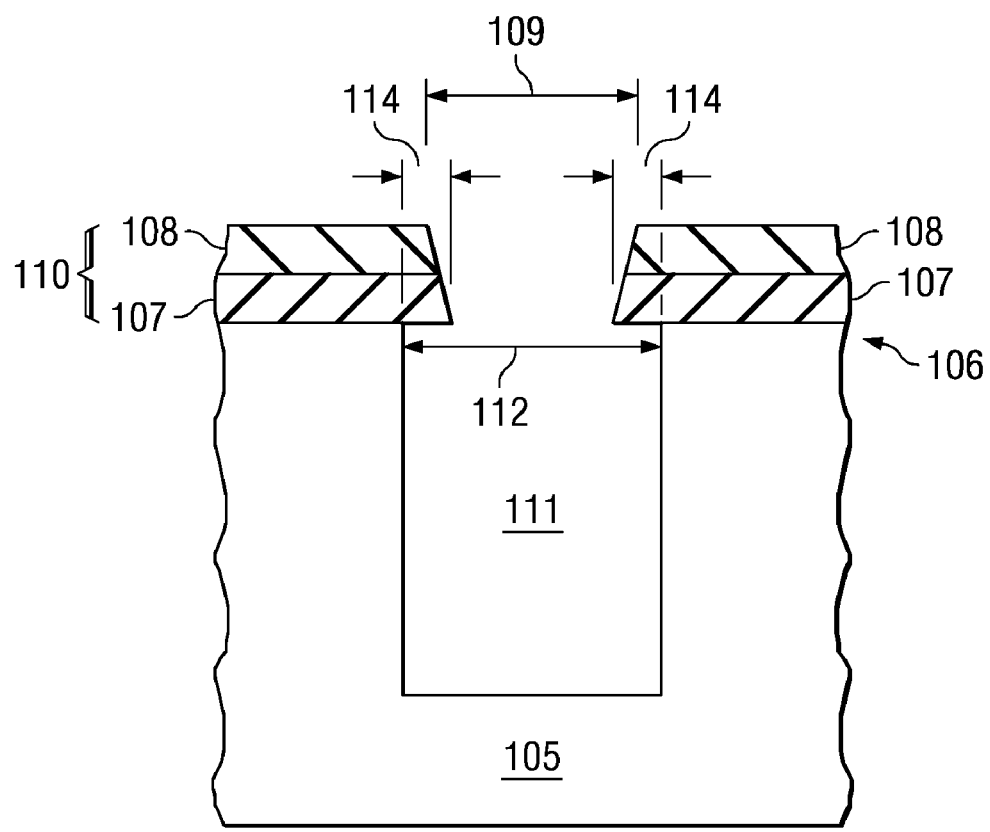
FIGS. 3A-C show simplified cross sectional depictions of a wafer portion following an etch process that creates a mask overhang and resulting lateral undercut of the substrate under the masking layers, then a wet etch-based process to reduce or eliminate the mask overhang, and a final removal process for removing the sacrificial layer, according to an embodiment of the invention.
Figure 3B:
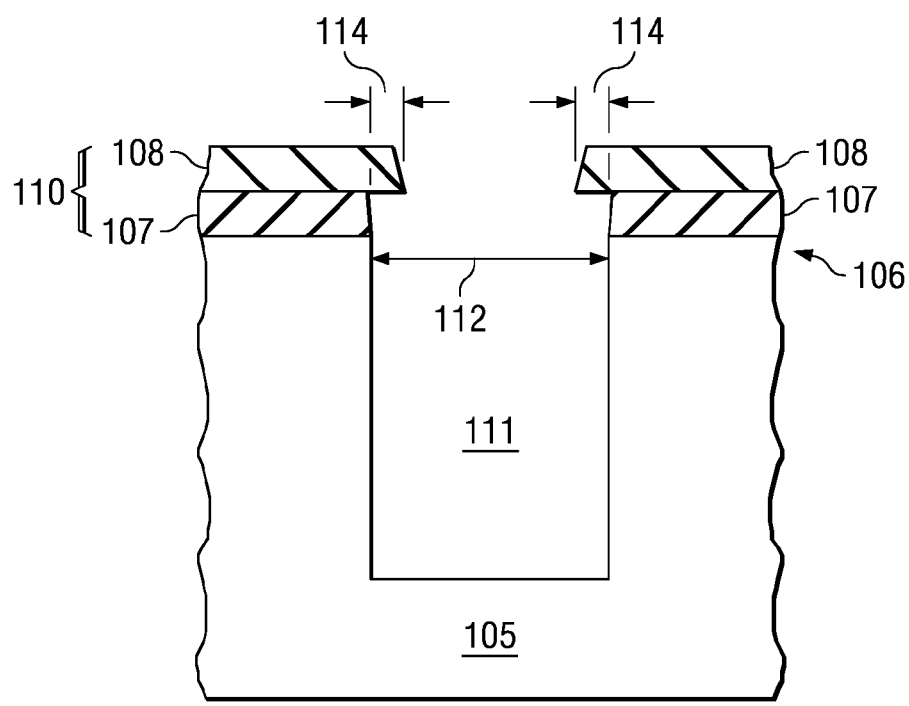
Figure 3C:
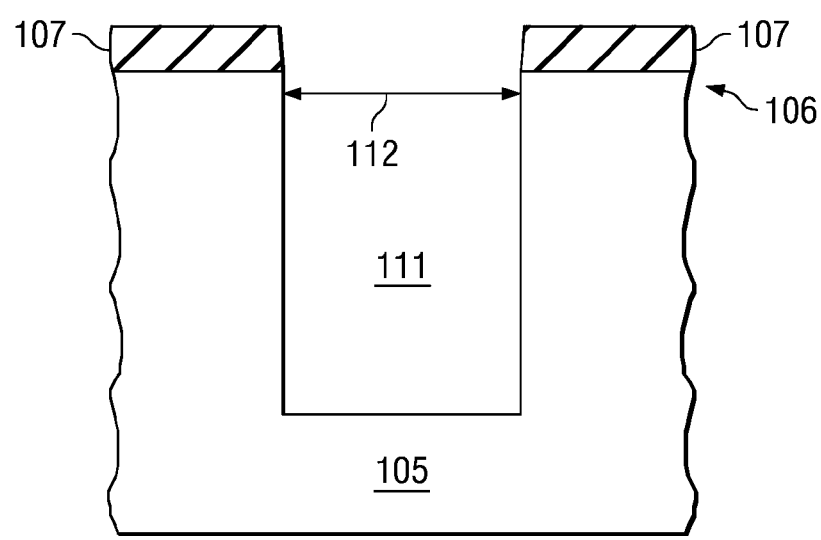

FIGS. 3A-C show simplified cross sectional depictions of a wafer portion following an etch process that creates a mask overhang and resulting lateral undercut in the substrate under a sacrificial layer/non-sacrificial masking layer stack, then a wet etch process to reduce or eliminate the lateral undercut, and then a final removal process for removing the sacrificial, respectively, according to an embodiment of the invention. The pullback process can comprise pulling back the dielectric or photoresist, or both, by wet etch. In both of these cases the photoresist can be subsequently stripped off, but the dielectric part of the mask remains (i.e. is non-sacrificial).

The structure shown in FIG. 3A is identical to that shown in FIG. 2A. FIG. 3B shows a cross sectional depiction following a wet pullback etch. The wet pullback etch process is exclusive of any additional patterning step since it uses the existing patterned masking layer stack 110. In one embodiment, the wet pullback etch comprises using an HF solution (e.g., buffered HF "BHF") in the case of a silicon oxide dielectric to pullback the non-sacrificial layer 107 to substantially reduce or eliminate the mask overhang region 114. Hot phosphoric acid can be used in the case the sacrificial masking layer 108 comprises silicon nitride. The conditions for the wet pullback etch process are selected to retain at least a portion of the masking layer stack 110 and reduce a length of the mask overhang region 114 by at least 50%, or to eliminate the mask overhang (e.g., form a positive step).

Due to the isotropic etch characteristics of wet etching in general, the etch time to remove the mask overhang region 114 can be set based on the length of the mask overhang region 114 and the etch rate of the non-sacrificial layer 107. In one embodiment, an overetch is used to ensure elimination of the overhang region 114, such as using a time selected to achieve approximately a 2× overetch. Overetch increases the critical dimension (CD) of the feature, but the resulting positive step does not generally cause filling problems. However, overetch may be limited in cases where an expanding CD may not be helpful. No end point or other metrology is generally needed for the etches according to embodiments of the invention.

FIG. 3C shows a cross sectional depiction after removal of a top sacrificial layer 108 of masking layer stack 110. In the embodiment shown, top sacrificial layer 108 can comprises photoresist, and a conventional photoresist stripping processes can be used. The mask overhang region 114 that is shown in FIGS. 3A and 3B can be seen to be absent.

Figure 4A:
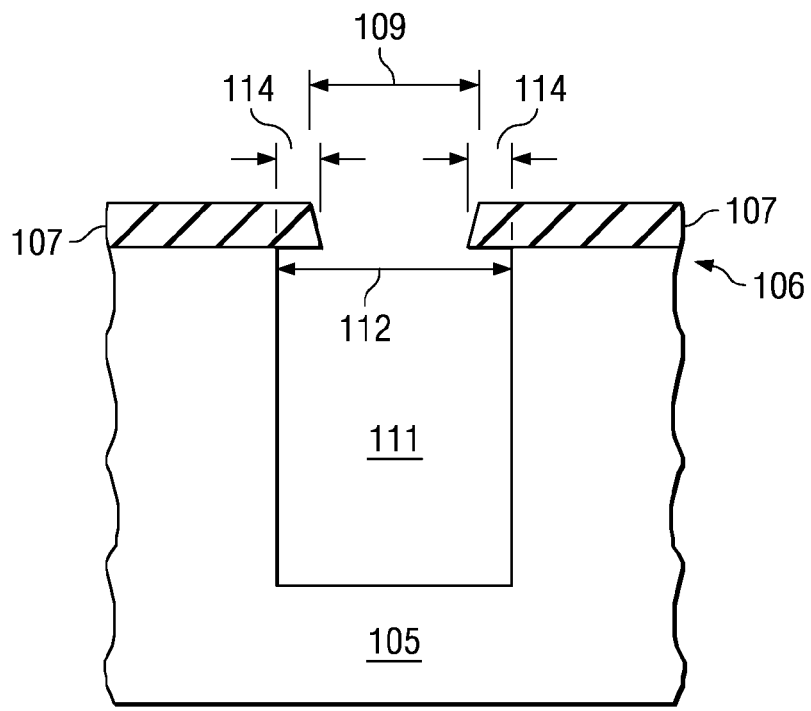
FIGS. 4A-B show simplified cross sectional depictions of a wafer portion following an etch process that creates a mask overhang and resulting lateral undercut of the substrate under a non-sacrificial masking layer, then a dry or wet pullback etch process to provide a positive step that eliminates the lateral undercut, respectively, according to an embodiment of the invention.
Figure 4B:
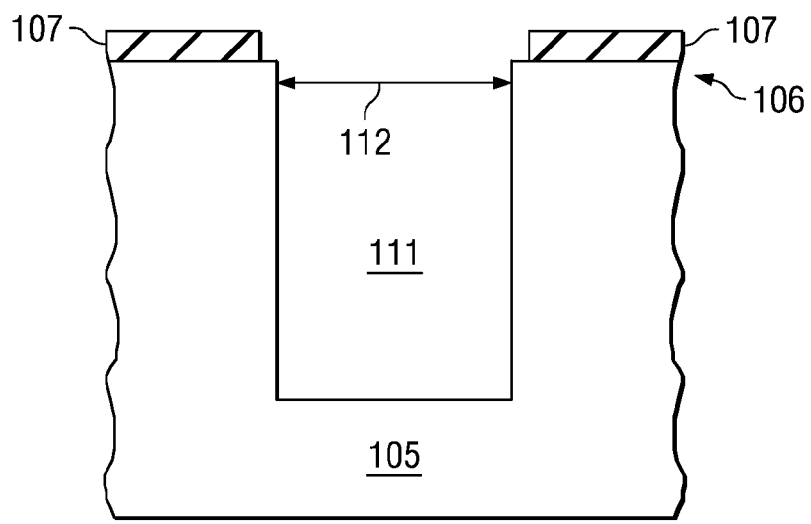

FIGS. 4A-B show simplified cross sectional depictions of a wafer portion following an etch process that creates a mask overhang and resulting lateral undercut in the substrate under a non-sacrificial masking layer, then a dry or wet pullback etch process to reduce or eliminate the mask overhang and resulting lateral undercut, respectively, according to an embodiment of the invention. The structure shown in FIG. 4A is identical to that shown in FIGS. 2A and 3A, except the top sacrificial layer 108 has been excluded. FIG. 4B shows a cross sectional depiction following a dry or wet pullback etch of non-sacrificial layer 107.

This embodiment allows some of the non-sacrificial part of the mask which comprises non-sacrificial layer 107 shown in FIGS. 4A and 4B to be vertically and laterally etched during the pullback etch. The pullback etch can be seen to have removed the entire mask overhang region 114 to create a slight positive step and to also have thinned non-sacrificial layer 107. The dry or wet pullback etch process is exclusive of any additional patterning step since it utilizes non-sacrificial layer 107. The conditions for the dry or wet pullback etch process are selected to retain at least a portion of the masking layer stack 110 and reduce a length of the mask overhang region 114 by at least 50% or to eliminate the mask overhang region (e.g. to form a positive step, such as the positive step shown). In one embodiment, the wet pullback etch comprises an HF or BHF solution in the case of a silicon oxide dielectric for non-sacrificial layer 107 to pullback the non-sacrificial layer 107 to substantially reduce or eliminate the mask overhang region 114. In the case of a wet etch, as noted above, due to the isotropic etch characteristics of wet etching in general, the etch time can be set based on the length of the mask overhang region 114 and the etch rate of the non-sacrificial layer 107, such as to achieve a 1.5× or 2× overetch.

Figure 5:
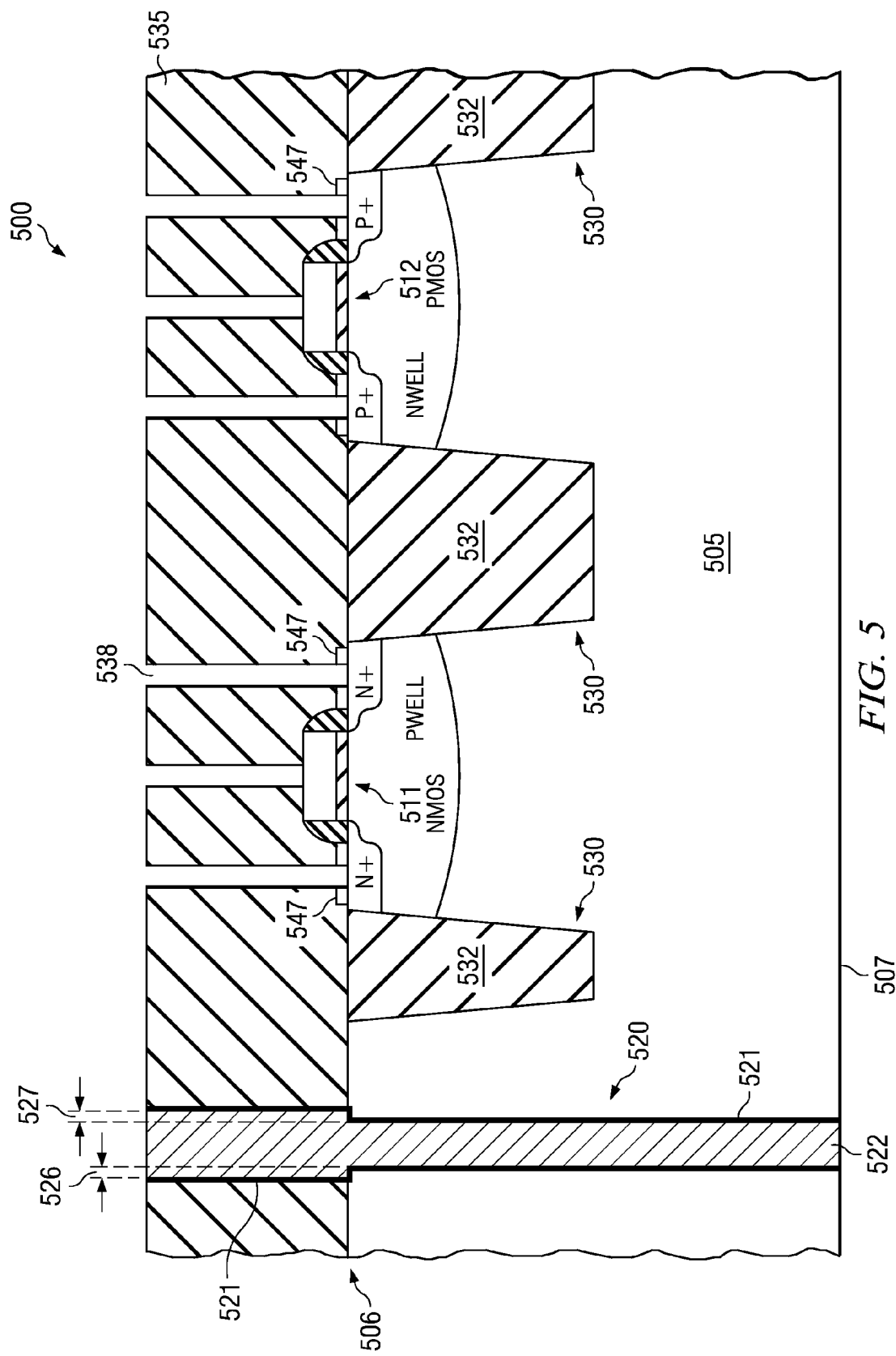
FIG. 5 shows a simplified cross sectional depiction of a CMOS IC portion having filled etch features that have positive steps and step symmetry, according to an embodiment of the invention.

FIG. 5 shows a simplified cross sectional depiction of a CMOS IC 500 portion according to an embodiment of the invention. Metallization and passivation are not shown for simplicity. IC 500 includes a substrate 505, such as a bulk Si substrate, having a top semiconductor surface 506 and a bottom surface 507, and at least one semiconductor device comprising NMOS transistor 511 and PMOS transistor 512 formed in or on the top semiconductor surface 506. IC 500 is shown including a first filled etched feature type 520 shown as TSV 520 and a second etched feature type 530 shown as trench isolation 530 formed in the substrate 505. More generally, IC 500 has at least one filled etched feature type. A pre-metal dielectric (PMD) layer 535 is shown over the top semiconductor surface 506. Contacts 538 are shown formed in the PMD 535 to allow electrical contact to be made to features on the top semiconductor surface 506. The metallization/barrier metal that generally fills the contacts 538 are not shown for simplicity.

The TSV 520 and trench isolation 530 each generally have a depth of least 1 μm. By definition, the depth of the TSV is generally equal to the thickness of substrate 505. The trench isolation 530 can be a shallow trench isolation to a deep trench isolation (e.g., >10 μm). The trench isolation 530 is shown filled exclusively with a dielectric material 532.

The TSV comprises an optional dielectric liner 521 within substrate 505 having an electrically conductive material 522 (e.g., copper or a copper alloy, or tungsten) within the liner 521 and extending through a contact aperture in the PMD 535 that is filled with electrically conductive material 522. Seed and barrier layers which are generally present in the TSV 520 beneath electrically conductive material 522 when electrically conductive material 522 comprises copper are not shown for simplicity. Metallization from one of the metal layer, such as M1 (not shown), makes contact to the electrically conductive material 522 of TSV 520 on the topside of IC 500. Although TSV 520 is shown in an arrangement for coupling to a first metal level (M1), as known in the art TSV can generally contact any level of the IC, such as M2, M3, etc.

At the surface of TSV 520 the PMD layer 535 can be seen to evidence positive steps. PMD layer 535 was present during etching of the trench/via to form TSV 520, remains for subsequent processing (e.g., multi-level metal and passivation processing), is present in the IC 500 portion shown in FIG. 5, and is thus a non-sacrificial masking layer. In another embodiment, the non-sacrificial layer for forming TSV 520 comprises and anti-reflective coating (ARC) material, such as silicon oxynitride or silicon nitride.

A positive first step 526 is seen on both a first side and a positive second step 527 is seen on a second opposing side of PMD layer 535 near a surface portion of electrically conductive material 522 of TSV 520. The positive first step 526 and positive second step 527 have perfect or near perfect symmetry, having respective lengths on opposing sides of the TSV 520 averaging within 5% of one another resulting from a pullback etch embodiment according to an embodiment of the invention. The actual percentage difference between opposing sides of the etched feature is likely on the order of 1%, or less, but is not considered measurable to such a level with current available metrology. In contrast, using the known methods for undercut reduction comprising an extra masking/patterning step, symmetry will not be present due to some inherent offset/misalignment relative to the position of etched feature (e.g., via).

Similarly, at the surface of trench isolation 530 masking layer 547 can be seen to evidence a positive step having perfect or near perfect symmetry. Masking layer 547 was present during etching of the trench/via to form trench isolation 530, remains for subsequent processing (e.g., multi-level metal and passivation processing), is present in final IC portion 500, and is thus a non-sacrificial masking layer. The etching including pullback etching to form TSV 520 and trench isolation 530 are completely independent process steps, with trench isolation generally being formed earlier in the process as compared to TSV 520.

Figure 6:
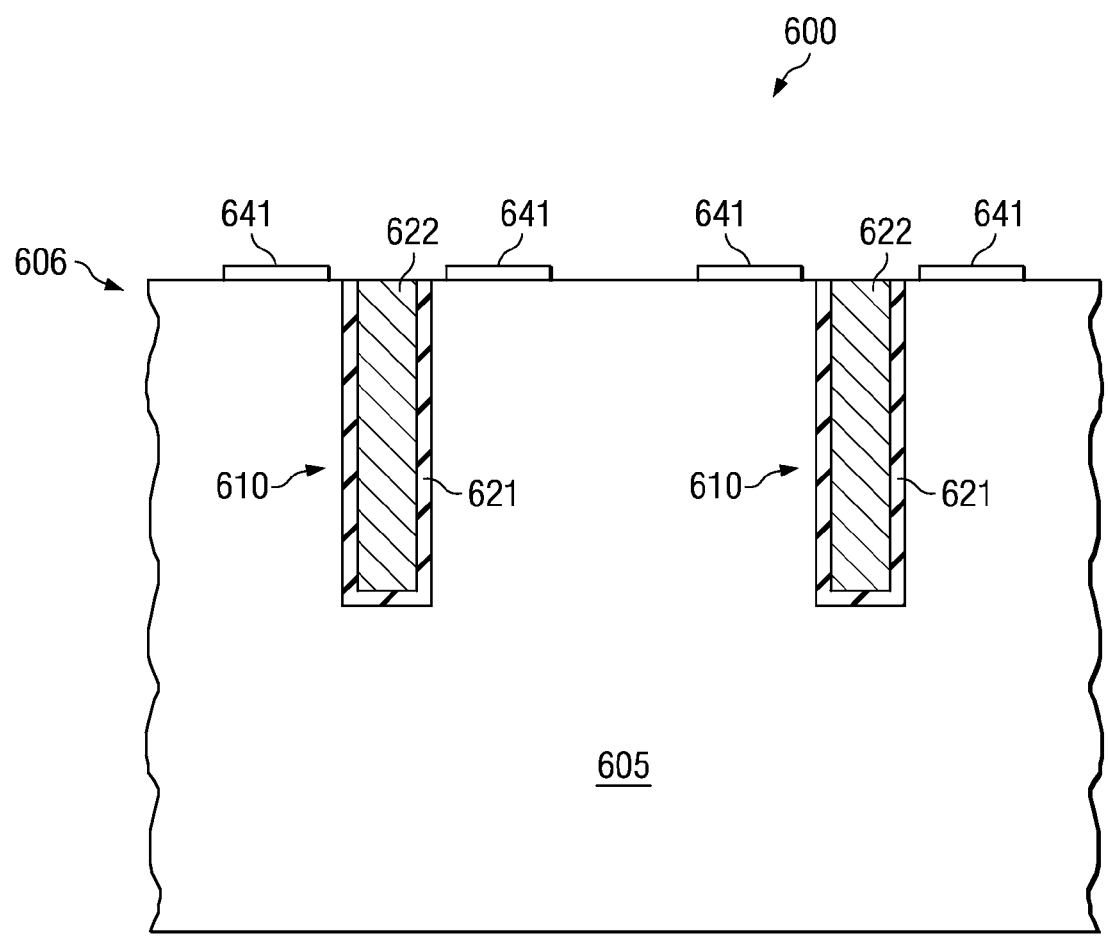
FIG. 6 shows a simplified cross sectional depiction of an IC portion including a dynamic random access memory (DRAM), with the DRAM trench capacitor portions shown.

As described above, embodiments of the invention are broadly applicable to the formation of filled etch features. Although not shown in FIG. 5, embodiments of the invention can be used to provide reduced or eliminated substrate undercut to improve filling of other filled etch features. For example, FIG. 6 shows a simplified cross sectional depiction of an IC 600 including a dynamic random access memory (DRAM), with the DRAM trench capacitor portions 610 shown. DRAM trench capacitor is formed in substrate 605 that includes a top semiconductor surface 606. DRAM capacitor portion 610 comprises a dielectric 621 liner that is filled with an electrically conductive material 622, such as degeneratively doped polysilicon. At the surface of DRAM capacitor portion 610 over top semiconductor surface 606 is a masking layer 641 that in certain process flows can be present during etching of the trench to form DRAM capacitor portion 610 (i.e. a non-sacrificial masking layer). DRAM capacitor portion 610 shown in FIG. 6 evidences a positive first step on a first side and a positive second step on a second opposing side of the top semiconductor surface 606. DRAM trench capacitors, such as DRAM capacitors comprising DRAM capacitor portion 610 can be formed by Si RIE substrate etching, followed by mask overhang reduction or elimination processing according to an embodiment of the invention to reduce or eliminate lateral substrate undercut, followed by polysilicon deposition and polysilicon doping (e.g., in-situ doped polysilicon process) to fill the etched feature with electrically conductive material.

EXAMPLES

Embodiments of the present invention are further illustrated by the following specific Examples, which should not be construed as limiting the scope or content of embodiments of the invention in any way.

A plurality of test chips comprising bulk Si wafers were prepared which each had 4.4 µm of silicon oxide and a 4 µm photoresist layer thereon that was patterned to form a plurality of feature regions (analogous to the cross sectional depictions shown in FIGS. 2A and 3A). A Si etch process etched 130 µm deep vias in the silicon and was found to be laterally undercut beneath the silicon oxide layer by between 0.6-0.7 µm and form mask overhang regions of that same length range, measured using a scanning electron microscope (SEM). Then, with the photoresist still in place, the wafers were pullback etched according to an embodiment of the invention with a dry oxide etch comprising $CF_4$/Ar at a power of about 1,100 Watts, and a pressure of 150 to 400 mTorr, which removed the 0.6-0.7 µm of silicon oxide that overhung the etched Si edge. Following the overhang etch, the overhang region regions measured <0.1 µm.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A method, comprising:
    forming a first masking layer of a first material on a surface of a silicon wafer;
    forming an opening in a second masking layer of a second material different from the first material to expose a portion of the first masking layer;
    removing the exposed portion of the first masking layer to expose a portion of the silicon surface;
    removing the exposed silicon down to a depth to form an overhang portion of the first masking layer over an etched wall in the silicon wafer; and
    removing the overhang portion from the first masking layer without first removing the second masking layer.

2. The method of claim 1, in which the second masking layer is a photoresist layer.

3. The method of claim 1, in which the removing the overhang portion step includes a dry etch process.

4. The method of claim 1, in which the removing the overhang portion step includes a wet etch process.

5. The method of claim 1, in which the removing the overhang portion step removes the second masking layer.

6. The method of claim 1, further including at least partially filling the depth with a conductive material.

7. The method of claim 1, further including at least partially filling the depth with an insulating material.

* * * * *